United States Patent
Jones, III et al.

(10) Patent No.: US 7,521,934 B1
(45) Date of Patent: Apr. 21, 2009

(54) BATTERY CURRENT MEASUREMENT WITH REAL TIME PRE-GAIN ADJUST AND PROGRAMMABLE EXCITATION SOURCE

(75) Inventors: James Leroy Jones, III, Belleville, MI (US); Sam Yonghong Guo, Canton, MI (US); Yuanyuan Wu, Shelby Township, MI (US)

(73) Assignee: Yazaki North America, Inc., Canton, MI (US)

( * ) Notice: Subject to any disclaimer, the term of this patent is extended or adjusted under 35 U.S.C. 154(b) by 163 days.

(21) Appl. No.: 11/581,709

(22) Filed: Oct. 16, 2006

(51) Int. Cl.
*G01N 27/42* (2006.01)
*G01R 27/08* (2006.01)
*H02K 11/00* (2006.01)

(52) U.S. Cl. .................... 324/425; 324/713; 322/99
(58) Field of Classification Search ............. 324/425
See application file for complete search history.

(56) References Cited

U.S. PATENT DOCUMENTS

| | | | | |
|---|---|---|---|---|
| 3,685,868 A * | 8/1972 | Nagase et al. | ............. | 303/22.6 |
| 4,508,276 A * | 4/1985 | Malcolm | ............. | 239/691 |
| 4,680,529 A | 7/1987 | Komurasaki et al. | | |
| 5,231,344 A * | 7/1993 | Marumoto et al. | ............. | 322/14 |
| 5,325,044 A | 6/1994 | Bartol | | |
| 5,734,264 A | 3/1998 | Berna et al. | | |
| 5,744,744 A * | 4/1998 | Wakuda | ............. | 84/650 |
| 6,137,203 A | 10/2000 | Jermakian et al. | | |
| 6,348,751 B1 | 2/2002 | Jermakian et al. | | |
| 6,351,529 B1 * | 2/2002 | Holeva | ............. | 379/395 |
| 6,453,265 B1 | 9/2002 | Dekhil et al. | | |
| 6,466,026 B1 | 10/2002 | Champlin | | |
| 6,489,693 B1 | 12/2002 | Hetzler | | |
| 6,542,838 B1 | 4/2003 | Haddad et al. | | |
| 6,566,856 B2 | 5/2003 | Sandquist et al. | | |
| 2001/0052769 A1 * | 12/2001 | Simmonds et al. | ............. | 324/204 |
| 2002/0128759 A1 * | 9/2002 | Sodoski et al. | ............. | 701/36 |
| 2004/0135591 A1 | 7/2004 | Tsutsui | | |

* cited by examiner

*Primary Examiner*—Vincent Q Nguyen
*Assistant Examiner*—Jeff Natalini
(74) *Attorney, Agent, or Firm*—Harness, Dickey & Pierce, P.L.C.

(57) ABSTRACT

A current measurement control system for a power supply system is provided. The current measurement control system includes a load module that estimates a total load of the power supply system. An amplification module selectively determines an amplification factor based on the total load and amplifies a current signal based on the amplification factor. A current measurement module measures current based on the amplified current signal.

10 Claims, 8 Drawing Sheets

| | 512 | 256 | 128 | 64 | 32 | Amp Value |
|---|---|---|---|---|---|---|
| 402 | 0 | 0 | 0 | 0 | 0 | 32 |
| 404 | 0 | 0 | 0 | 0 | 1 | 16 |
| 406 | 0 | 0 | 0 | 1 | 0 | 10 |
| 408 | 0 | 0 | 0 | 1 | 1 | 8 |
| | 0 | 0 | 1 | 0 | 0 | 5 |
| | 0 | 0 | 1 | 0 | 1 | 5 |
| | 0 | 0 | 1 | 1 | 0 | 4 |
| | 0 | 0 | 1 | 1 | 1 | 4 |
| | 0 | 1 | 0 | 0 | 0 | 2 |
| | 0 | 1 | 0 | 0 | 1 | 2 |
| | 0 | 1 | 0 | 1 | 0 | 2 |
| | 0 | 1 | 0 | 1 | 1 | 2 |
| | 0 | 1 | 1 | 0 | 0 | 2 |
| | 0 | 1 | 1 | 0 | 1 | 2 |
| | 0 | 1 | 1 | 1 | 0 | 2 |
| | 0 | 1 | 1 | 1 | 1 | 2 |
| | 1 | 0 | 0 | 0 | 0 | 1 |
| | 1 | 0 | 0 | 0 | 1 | 1 |
| | 1 | 0 | 0 | 1 | 0 | 1 |
| | 1 | 0 | 0 | 1 | 1 | 1 |
| | 1 | 0 | 1 | 0 | 0 | 1 |
| | 1 | 0 | 1 | 0 | 1 | 1 |
| | 1 | 0 | 1 | 1 | 0 | 1 |
| | 1 | 0 | 1 | 1 | 1 | 1 |
| | 1 | 1 | 0 | 0 | 0 | 1 |
| | 1 | 1 | 0 | 0 | 1 | 1 |
| | 1 | 1 | 0 | 1 | 0 | 1 |
| | 1 | 1 | 0 | 1 | 1 | 1 |
| | 1 | 1 | 1 | 0 | 0 | 1 |
| | 1 | 1 | 1 | 0 | 1 | 1 |
| | 1 | 1 | 1 | 1 | 0 | 1 |
| 410 | 1 | 1 | 1 | 1 | 1 | 1 |

*Figure 7*

BATTERY CURRENT MEASUREMENT WITH REAL TIME PRE-GAIN ADJUST AND PROGRAMMABLE EXCITATION SOURCE

FIELD

The present teachings relate to methods and systems for measuring current of a power supply system.

BACKGROUND

Measuring current draw of a power system can be difficult due to large variances in the total electrical load. The total load of power systems vary according to the activation and deactivation of the various electrical components at any one time. For example, the load in a vehicle can vary between a few milli-amps and about one thousand amps (e.g., while starting the vehicle engine).

Typically, current measurement methods include multiple current sensors to measure the large dynamic range of current. A first sensor is calibrated to sense the current at higher ranges. A second sensor is calibrated to sense the current at lower ranges. One or more switches are controlled to activate one of the first and second sensors. Various complex switch control methods exist for activating and deactivating the sensors such that the appropriate current sensors are activated at the appropriate time. Although the complex switch control methods are minimally disruptive, providing the additional sensor can be costly.

SUMMARY

The present teachings generally include a current measurement control system for a power supply system. The current measurement control system includes a load module that estimates a total load of the power supply system. An amplification module selectively determines an amplification factor based on the total load and amplifies a current signal based on the amplification factor. A current measurement module measures current based on the amplified current signal.

Further areas of applicability will become apparent from the description provided herein. It should be understood that the description and specific examples are intended for purposes of illustration only and are not intended to limit the scope of the present teachings.

BRIEF DESCRIPTION OF THE DRAWINGS

The drawings described herein are for illustration purposes only and are not intended to limit the scope of the present teachings in any way.

FIG. 7 shows an exemplary expected load to gain mapping table in accordance with the present teachings.

DETAILED DESCRIPTION

Figure 1:
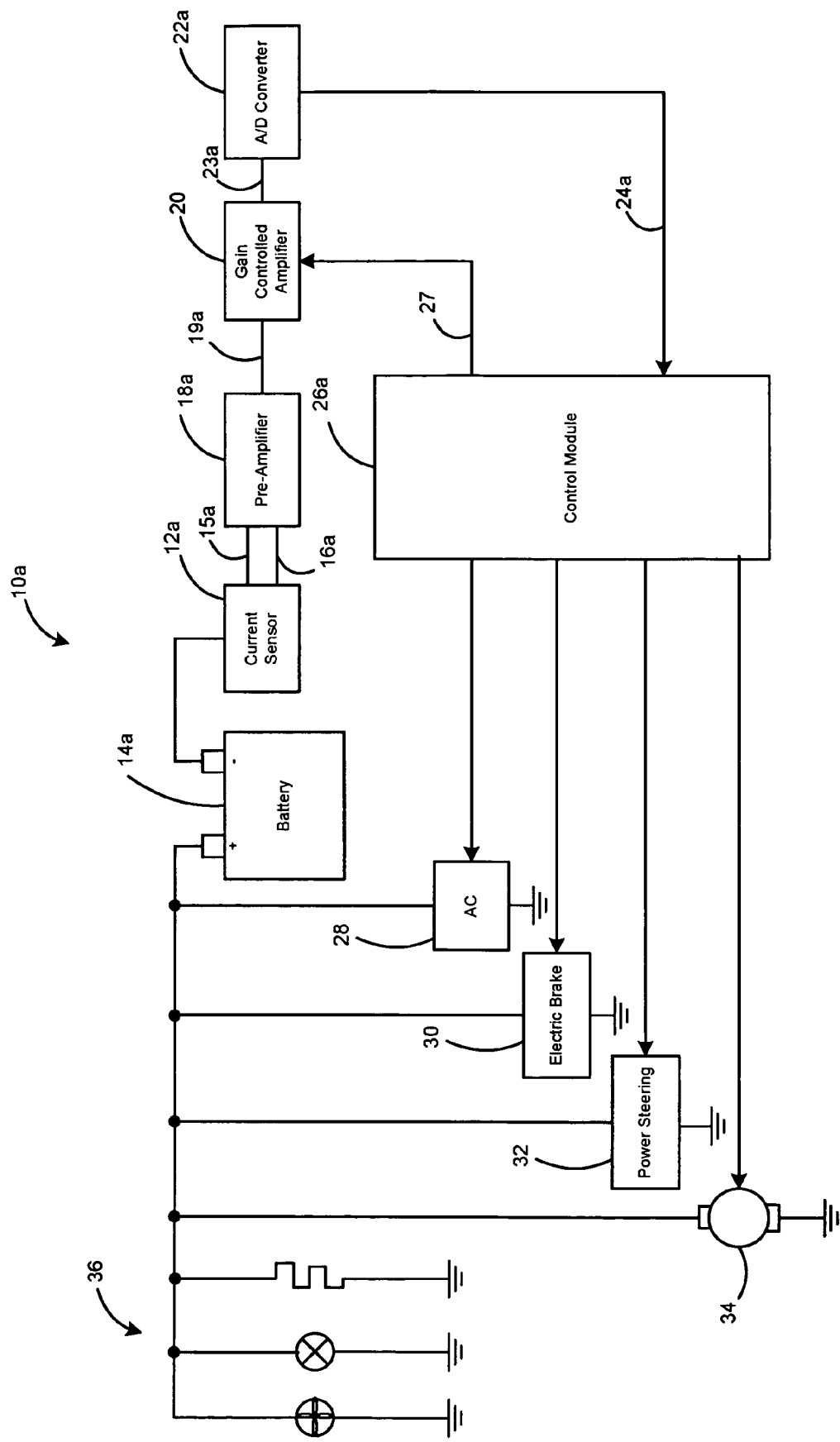
FIG. 1 is a block diagram illustrating a current measurement system including a gain-controlled amplifier in accordance with one aspect of the present teachings.

The following description is merely exemplary in nature and is not intended to limit the present teachings, their application, or uses. It should be understood that throughout the drawings, corresponding reference numerals indicate like or corresponding parts and features. As used herein, the term module, control module, component and/or device can refer to one or more of the following: an application specific integrated circuit (ASIC), an electronic circuit, a processor (shared, dedicated or group) and memory that executes one or more software or firmware programs, a combinational logic circuit and/or other suitable mechanical, electrical or electro-mechanical components that can provide the described functionality and/or combinations thereof.

With reference FIG. 1 and in one aspect of the present teachings, a current measurement system 10a can include a single current sensor 12a that can be employed to sense a current from a battery 14a and can generate a battery current signal in response thereto. It will be appreciated that in light of the disclosure, the current sensor 12a can be implemented above or below ground depending on the flow of battery current.

A pre-amplifier 18a can receive and can amplify the battery current signal, which can be a negative signal 16a and/or a positive signal 15a. A gain-controlled amplifier 20 can receive and further can amplify the once-amplified battery current signal 19a. The amplification of the once-amplified battery current signal 19a can be based on a determined gain signal 27. An A/D converter 22a can receive the twice-amplified signal 23a and can convert the signal to a digital signal 24a. A control module 26a can receive the digital signal 24a and can estimate a current based thereon.

The control module 26a can control and/or can monitor various loads. It will be appreciated that the current measurement system in one aspect of the present teachings can be applicable to various power systems that can include various types of loads. For exemplary purposes, various aspects of the present teachings will be discussed in the context of a vehicle and associated exemplary vehicle loads.

A vehicle power system can include, for example, various heavy loads such as an air conditioner (AC) 28, electric brakes 30, power steering 32, a starter 34, various low loads 36 and/or one or more combinations thereof. The control module 26a can communicate a gain signal 27 to dynamically adjust the gain-controlled amplifier 20. One or more dynamic adjustments of the gain-controlled amplifier 20 can be based on one or more activated loads. For example, the control module 26a can set the gain to a highest gain value when only small loads are ON. The control module 26a can also set the gain to a lowest gain value when all heavy loads are ON. Once the gain is set, the control module 26a can commence the measurement of current based on the digital signal 24a.

Figure 2:
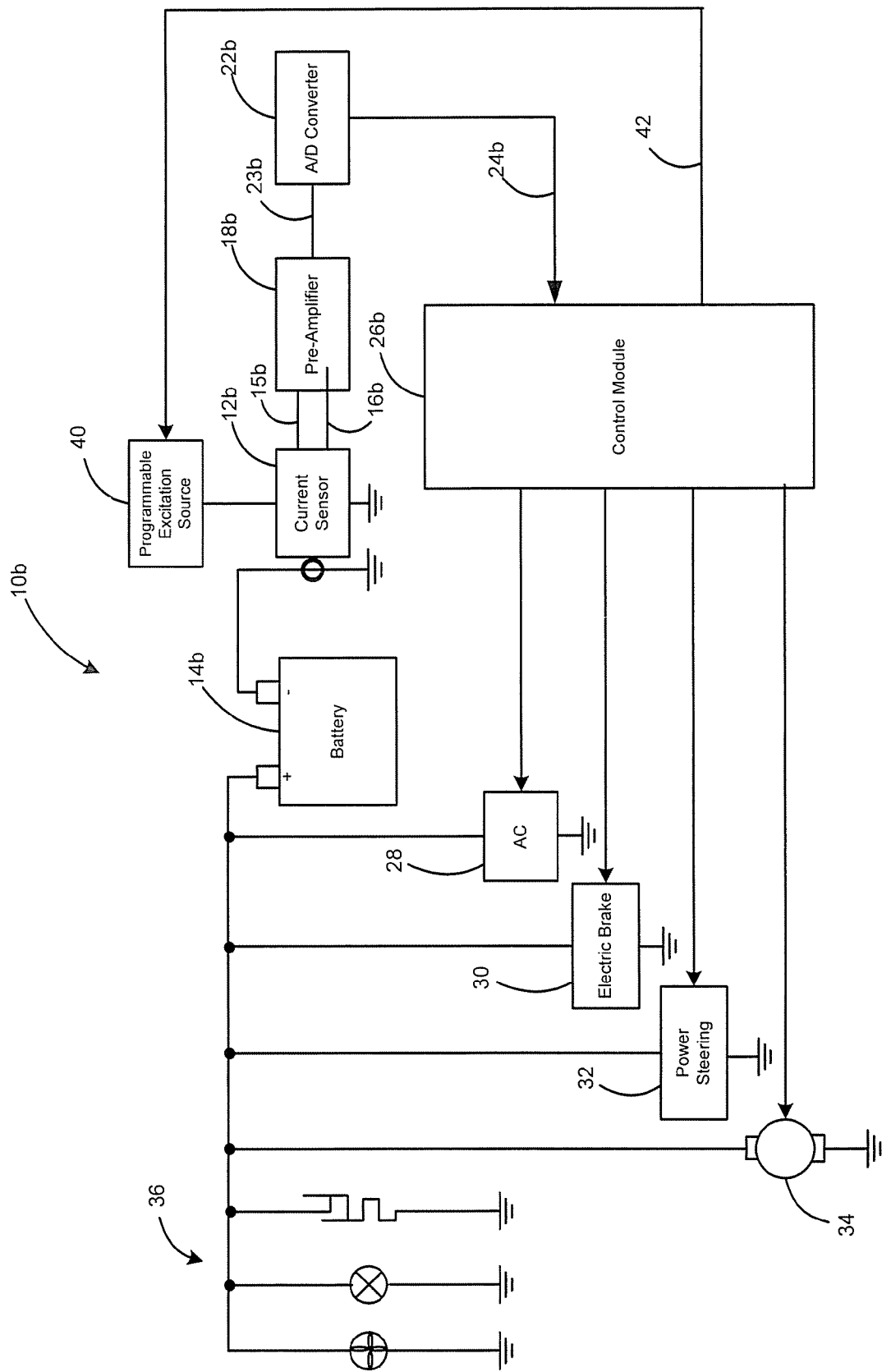
FIG. 2 is a block diagram illustrating a current measurement system including a programmable excitation source in accordance with another aspect of the present teachings.

With reference to FIG. 2 and in a further aspect of the present teachings, a current measurement system 10b can include a programmable excitation source 40 that can be in place of the gain controlled amplifier 20 of FIG. 1. The programmable excitation source 40 can provide an excitation supply to a current sensor 12b. A pre-amplifier 18b further can amplify the excited current sensor signals, which can be a negative signal 16b and/or a positive signal 15b. An A/D converter 22b can convert an amplified signal 23b to a digital signal 24b. The control module 26b, instead of dynamically determining a gain, can dynamically determine an excitation level. The dynamic determination of the excitation level can be based on the activated load configuration. The control module 26b can communicate an excitation level signal 42 that can be based on the dynamic determination of the excitation level to the programmable excitation source 40.

Figure 3:
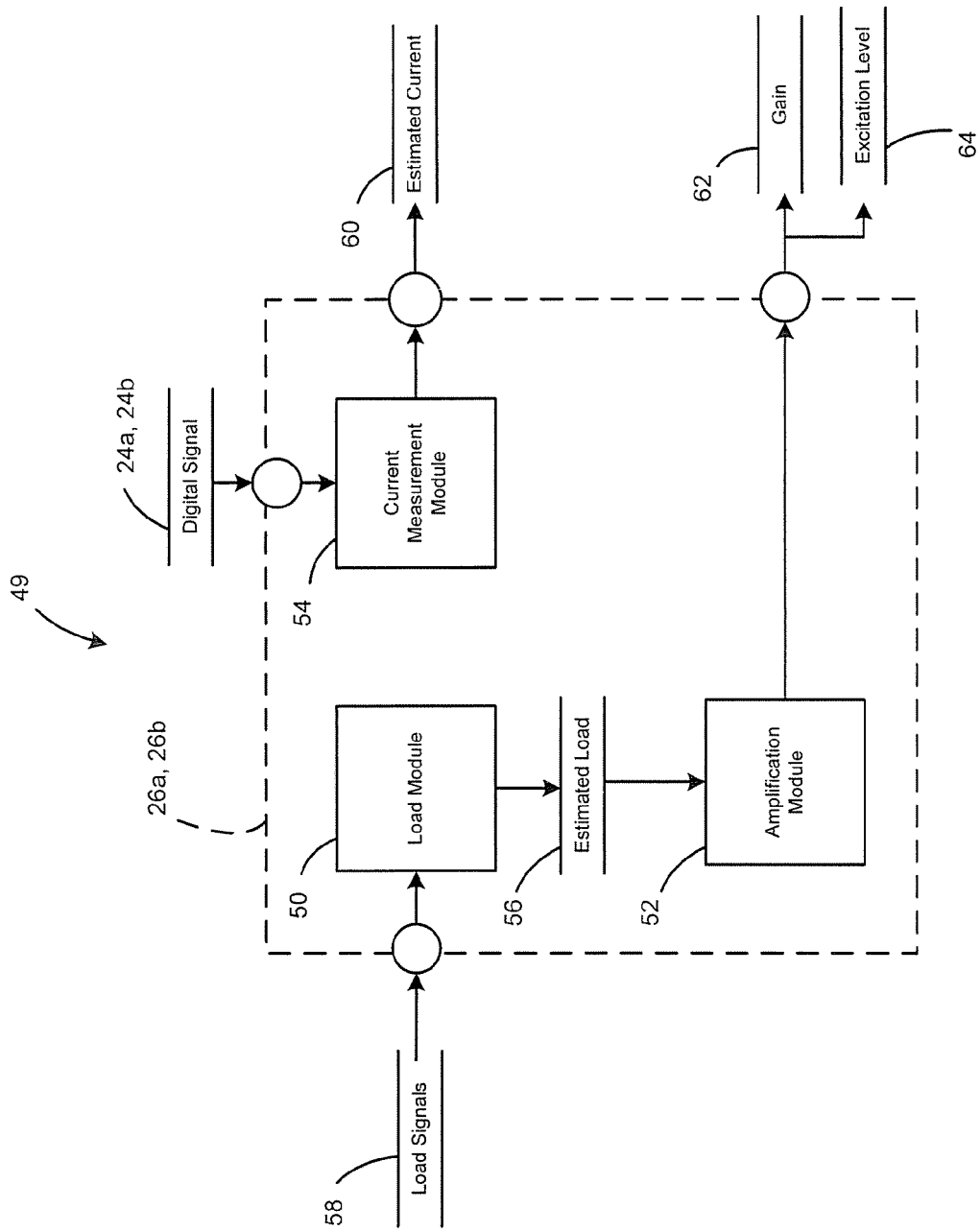
FIG. 3 is a dataflow diagram illustrating a control module of the current measurement system in accordance with various aspects of the present teachings.

Referring to FIG. 3, a current measurement control system 49 can be embedded within the control module 26a and/or the control module 26b. The current measurement control system 49 can include any number of sub-modules that can be combined and/or further partitioned to provide the suitable current measuring functionality. The current measurement control system 49 may be similarly implemented for both the current measurement system 10a of FIG. 1 and the current measurement system 10b of FIG. 2. To that end, the control module 26a, 26b can include a load module 50, an amplification module 52, a current measurement module 54, other suitable modules and/or one or more combinations thereof.

The load module 50 can estimate a total load 56 based on the activity of one or more loads 28, 30, 32, 34, 36 (FIGS. 1 and 2). The activity is determined based on one or more load signals 58. The amplification module 52 can determine an amplification factor to be a gain 62 and/or an excitation level 64 based on the estimated total load 56. The gain 62 can be output by the control module 26a to control the gain controlled amplifier 20 of FIG. 1. The excitation level 64 can be output by the control module 26b to control the programmable excitation source 40 of FIG. 2. Once the gain 62 and/or excitation level 64 is determined, the current measurement module 54 measures current 60 based on the digital signal 24a, 24b (as applicable). The current 60 can be used by other sub-modules (not specifically illustrated) within the control module 26a, 26b and/or output to other control modules (not specifically illustrated) for diagnostic and system control purposes.

Figure 4:
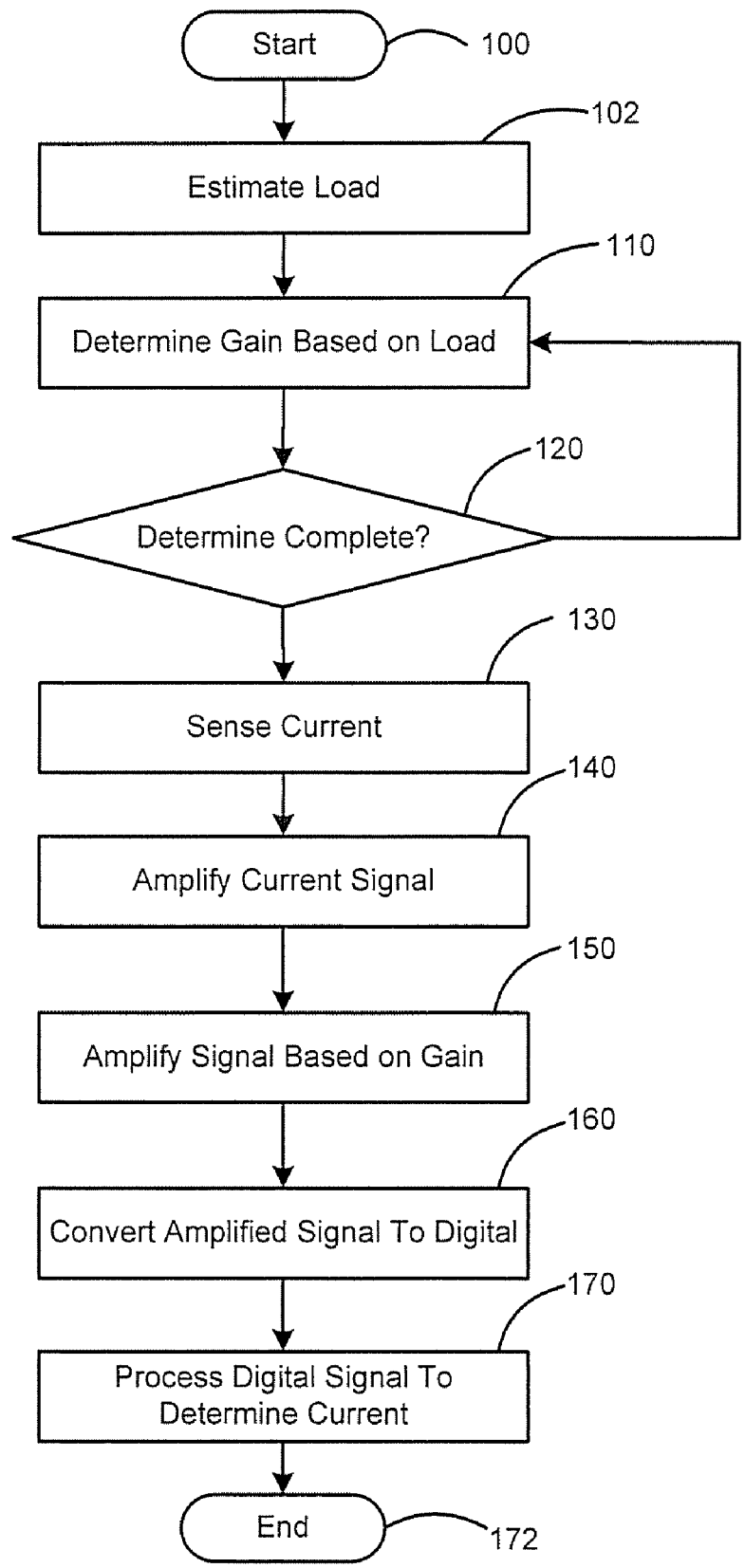
FIG. 4 is a process flow diagram illustrating a current measurement method in accordance with one aspect of the present teachings.

With reference to FIG. 4, one aspect of the present teachings includes a current measurement method that can be performed by one or more components of the current measurement system 10a (FIG. 1) including the gain controlled amplifier 20. For example, the current measurement method can begin at 100. At 102, a total load can be estimated based on the activation of various loads. At 110, a gain can be determined based on the estimated load. Once the determination of the gain is complete at 120, a current can be sensed from a battery at 130. A current signal (i.e., a signal based on sensing the current) can be once amplified at 140. The once amplified signal can be further amplified based on the gain at 150. The twice amplified signal can be converted to a digital signal at 160. The digital signal can be processed to determine a current measurement at 170. The method can end at 172.

Figure 5:
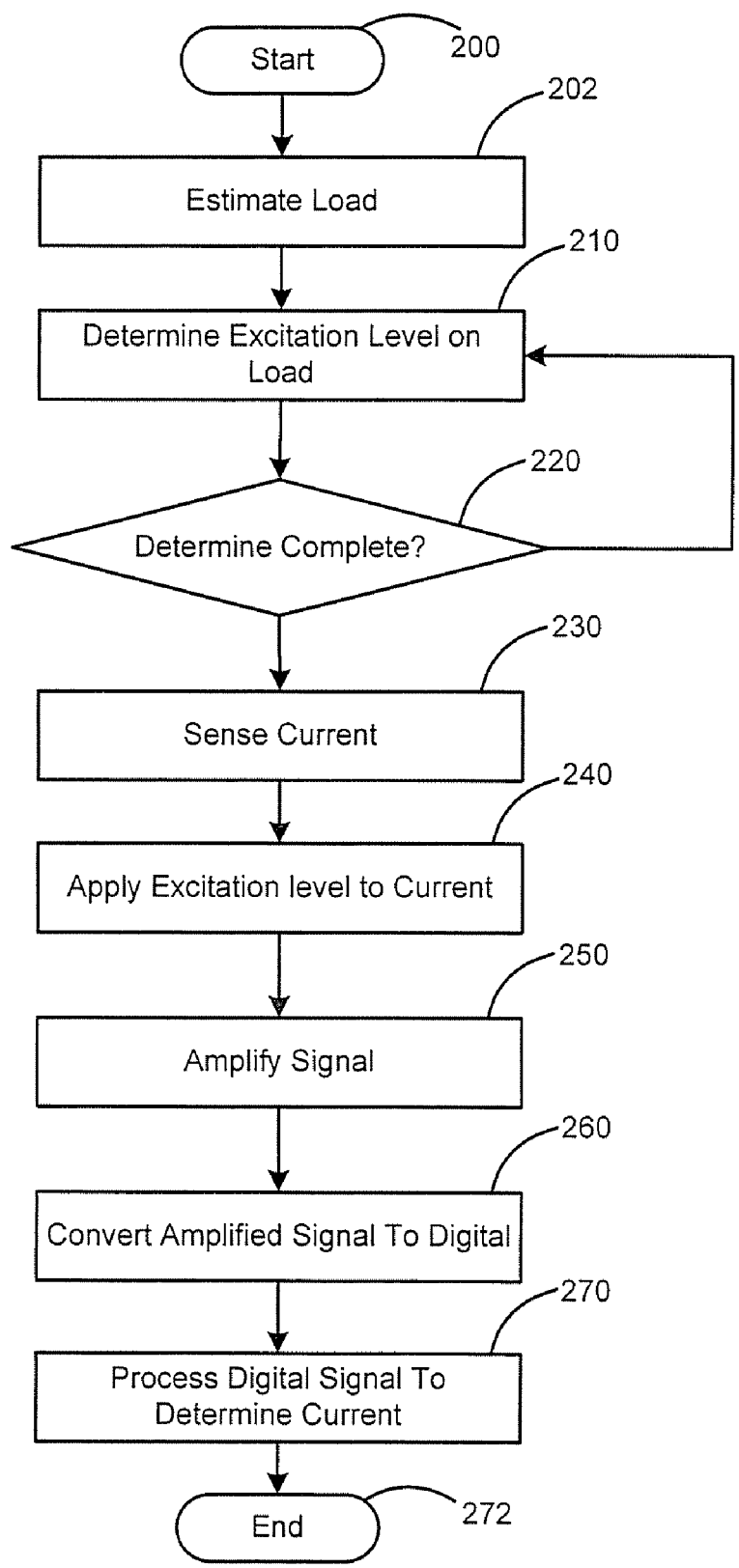
FIG. 5 is a process flow diagram illustrating a current measure method in accordance with another aspect of the present teachings.

With reference to FIG. 5, a further aspect of the present teachings includes a current measurement method that can be performed by one or more components of the current measurement system 10b (FIG. 2) including the programmable excitation source 40. For example, the current measurement method can begin at 200. At 202, a total load can be estimated based on the activation of various loads. At 210, an excitation level can be determined based on the estimated total load. Once the determination of the excitation level is complete at 220, the current can be sensed from the battery at 230. The current signal can be once amplified at 240 by applying the excitation level to the current. The sensor signal can be amplified at 250. The amplified signal can be converted to a digital signal at 260. The digital signal can be processed to determine a current measurement at 270. The method can end at 272.

Figure 6:
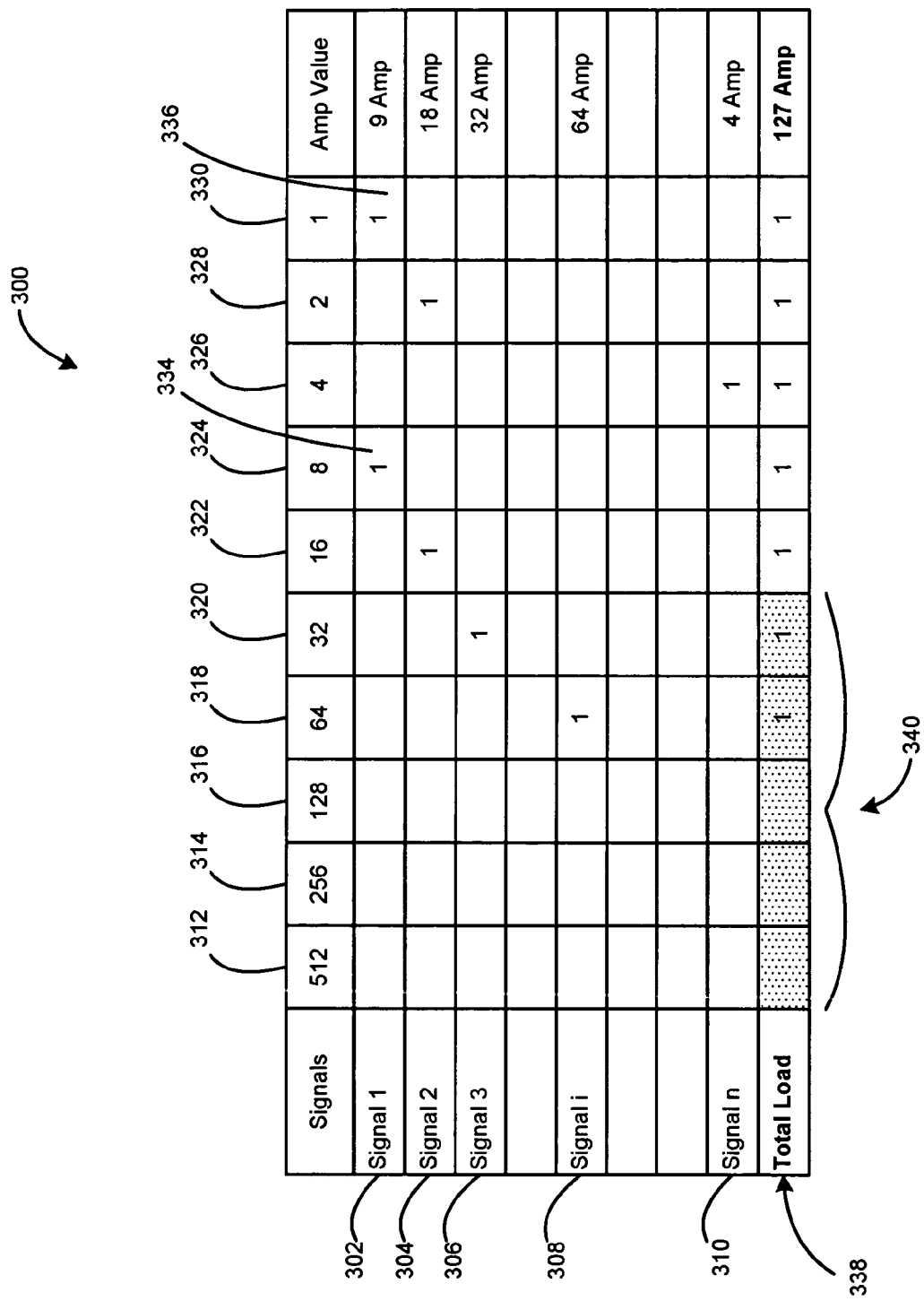
FIG. 6 shows an exemplary load definition table in accordance with the present teachings.

As shown in FIG. 6, the total load can be estimated based on a load definition table 300. The signal for each load can be represented in rows 302, 304, 306, 308, 310 and the corresponding current draw of each of the loads 302, 304, 306, 308, 310 can be represented in binary format in columns 312, 314, 316, 318, 320, 322, 324, 326, 328, 330. As shown, a first device can generate a first signal (Signal 1) that can draw nine Amps. Nine in binary format is 01001. Therefore, a one can be stored in cell 334 in the eight Amp column and cell 336 in the one Amp column. Once n signals are processed, a total load can be computed based on a summation of the n loads. The total load can be represented in binary format as shown at 338. The leftmost cells 340 can be used to represent the estimated total load.

As shown in FIG. 7, the gain can be determined from an expected load to gain table 400. The estimated total load can be represented in binary format in rows 402, 404, 406, 408, through 410. The corresponding gain can be represented in column 412. As provided in the example in FIG. 6, the leftmost cells 408 can be used to determine a gain 416 of eight. In light of the disclosure it will be appreciated that the excitation level can similarly be determined based on the estimated total load. Where, instead of determining a gain from column 412, an excitation level can be determined from column 412.

Figure 8:
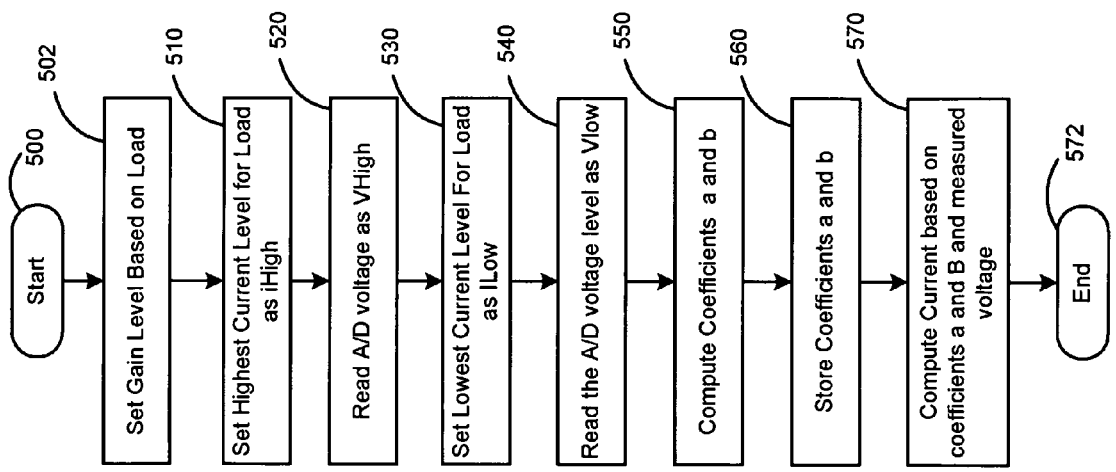
FIG. 8 is a process flow diagram illustrating a current computation method in accordance with the present teachings.

Referring now to FIG. 8, the current can be computed in place of or in addition to being determined from pre-defined tables. One aspect of the present teachings includes a current computation method. For example, the current computation method begins at 500. A gain level can be set based on a load combination at 502. A highest current level (Ihigh) for the load combination can be set at 510. The A/D voltage can be read and can be saved (Vhigh) at 520. A lowest current level (Ilow) for the load combination can be set at 530. The A/D voltage can be read and saved (Vlow) at 540. Coefficients "a" and "b" can be computed at 550, associated with the set gain, and stored at 560. Coefficients "a" and "b" can be an offset related to an error factor and a gain respectively. The offset of coefficient "a" can be computed by setting Ilow to zero. For example, "a" can be computed based on the following equation.

$$a = V\text{high} - b^*I\text{high}.$$

Coefficient "b" can be the resolution to range factor determined by the range of voltage divided by the range of current. For example, "b" can be computed based on the following equation.

$$b = (V\text{high} - V\text{low})/(I\text{high} - I\text{low}).$$

The coefficients "a" and "b" can be used along with a measured voltage (V) to estimate the current (I) at 570. The current can be estimated based on the following equation.

$$I = a + b^*V.$$

As can be appreciated, the current can be similarly computed based on excitation levels. Where, instead of setting a gain at 502, an excitation level can be set. And instead of associating coefficients "a" and "b" with the set gain at 560, the coefficients can be associated with the set excitation level and can be stored. During operation, the current can be measured based on the coefficients "a" and "b" retrieved by the excitation level.

While specific aspects have been described in this specification and illustrated in the drawings, it will be understood by those skilled in the art that various changes can be made and equivalents can be substituted for elements thereof without departing from the scope of the present teachings, as defined in the claims. Furthermore, the mixing and matching of features, elements and/or functions between various aspects of the present teachings may be expressly contemplated herein so that one skilled in the art will appreciate from the present teachings that features, elements and/or functions of one aspect of the present teachings may be incorporated into another aspect, as appropriate, unless described otherwise above. Moreover, many modifications may be made to adapt a particular situation, configuration or material to the present teachings without departing from the essential scope thereof. Therefore, it may be intended that the present teachings not be limited to the particular aspects illustrated by the drawings and described in the specification as the best mode presently contemplated for carrying out the present teachings but that the scope of the present teachings will include many aspects and examples following within the foregoing description and the appended claims.

What is claimed is:

1. A method of measuring current for a power supply system, comprising:
    determining a load combination;
    determining a first coefficient and associating the first coefficient with the load combination and an amplification factor;
    determining a second coefficient based on the first coefficient and associating the second coefficient with the load combination and the amplification factor;
    measuring a voltage of the power supply system; and
    estimating a current based on the voltage, the first coefficient, and the second coefficient.

2. The method of claim 1 further comprising:
    setting a first current level for the load combination;
    measuring a first voltage after setting the first current level;
    setting a second current level for the load combination;
    measuring a second voltage after setting the second current level;
    and wherein the first coefficient is determined based on the first current level, the first voltage, the second voltage, and the second current level.

3. The method of claim 2 wherein the determining the second coefficient is based on the first coefficient, the first voltage, and the first current.

4. The method of claim 1 further comprising setting a gain as the amplification factor based on the load combination.

5. The method of claim 1 further comprising setting an excitation level as the amplification factor based on the load combination.

6. A current measurement control system for power supply systems, comprising:
    a load module that determines a load combination;
    a control module that:
        determines a first coefficient associated with the load combination and an amplification factor;
        determines a second coefficient based on the first coefficient, the load combination and the amplification factor; and
        measures a voltage of the power supply system; and
    a current measurement module that estimates a current based on the voltage, the first coefficient, and the second coefficient.

7. The system of claim 6, wherein the control module:
    sets a first current level for the load combination;
    measures a first voltage after setting the first current level;
    sets a second current level for the load combination; and
    measures a second voltage after setting the second current level, wherein the first coefficient is determined based on the first current level, the first voltage, the second voltage, and the second current level.

8. The system of claim 7, wherein the second coefficient is based on the first coefficient, the first voltage, and the first current.

9. The system of claim 6, wherein the control module sets a gain as the amplification factor based on the load combination.

10. The system of claim 6, wherein the control module sets an excitation level as the amplification factor based on the load combination.

* * * * *